(12) United States Patent
Kim

(10) Patent No.: US 8,574,988 B2
(45) Date of Patent: Nov. 5, 2013

(54) METHOD FOR FORMING SEMICONDUCTOR DEVICE

(75) Inventor: Sei Jin Kim, Gyeonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 886 days.

(21) Appl. No.: 12/649,588

(22) Filed: Dec. 30, 2009

(65) Prior Publication Data
US 2010/0330793 A1 Dec. 30, 2010

(30) Foreign Application Priority Data
Jun. 29, 2009 (KR) .................. 10-2009-0058598

(51) Int. Cl.
*H01L 21/336* (2006.01)
(52) U.S. Cl.
USPC ................... 438/270; 257/E21.41
(58) Field of Classification Search
USPC .................... 438/270; 257/E21.41
See application file for complete search history.

(56) References Cited

U.S. PATENT DOCUMENTS 7,713,873 B2 * 5/2010 Kim et al. ............... 438/672
7,723,191 B2 * 5/2010 Kang et al. .............. 438/272

FOREIGN PATENT DOCUMENTS

| KR | 1020020053538 A | 7/2002 |
| KR | 1020050038351 A | 4/2005 |
| KR | 10-0843715 B1 | 6/2008 |
| KR | 10-0846099 B1 | 7/2008 |

* cited by examiner

Primary Examiner — William D Coleman
(74) Attorney, Agent, or Firm — Ladas & Parry LLP

(57) ABSTRACT

A method for forming a highly integrated semiconductor device having multiplayer conductive lines is presented. The method includes the operations of forming, etching, burying and forming. The first forming operation includes forming a line-type conductive layer on a semiconductor substrate including a buried gate to expose the gate. The etching operation includes etching the conductive layer to expose at least a region between one side of an active area defined in the semiconductor substrate and an opposite side of the neighboring active area, both the active areas being arranged next to each other in a major axis direction of the gate. The burying operation includes burying a first insulating film in the etched line-type conductive layer. The second forming operation includes forming a bit line passing through the center of the active area in a direction perpendicular to the major axis direction of the gate.

9 Claims, 6 Drawing Sheets (i)

(ii)

(iii)

(i)

(ii)

(iii)

(i)

(ii)

(iii)

METHOD FOR FORMING SEMICONDUCTOR DEVICE

CROSS-REFERENCE TO RELATED APPLICATION

The priority of Korean patent application No. 10-2009-0058598 filed Jun. 29, 2009, the disclosure of which is hereby incorporated in its entirety by reference, is claimed.

BACKGROUND OF THE INVENTION

1. Field of the Invention

The present invention relates to a method for forming a semiconductor device and more particularly, to a method for forming a semiconductor device including a bit line contact.

2. Background of the Invention

Recently, most electronic appliances include semiconductor devices. Semiconductor devices include electronic elements, such as transistors, resistors, capacitors, and the like. These electronic elements are designed to perform functions of the electronic appliances and are integrated on a semiconductor substrate. For example, electronic appliances, such as computers, digital cameras, and the like, include semiconductor devices, such as memory chips for storage of information, processing chips for control of information, and the like. Memory chips and processing chips include electronic elements integrated on a semiconductor substrate.

There is a need for increasing the integration degree of these types of semiconductor devices in order to satisfy consumer demands for superior performances and lower prices. Such increases in the integration degree of a semiconductor device entails a reduction brought about by the design rule which causes patterns of a semiconductor device to be increasing reduced. Although an entire chip area is increased with respect to the memory capacity, the semiconductor device is becoming super miniaturized and highly integrated. As a result, the area of a cell region where patterns of a semiconductor device are actually formed decreases. Accordingly, since a greater number of patterns should be formed in a more limited cell region in order to achieve a desired memory capacity, there is a need for forming microscopic patterns that have reduced critical dimensions.

Nowadays, various method for forming microscopic patterns have been developed, including, e.g., a method that uses a phase shift mask as a photo mask, a Contrast Enhancement Layer (CEL) method that uses a separate thin film capable of enhancing image contrast when formed on a wafer, a Tri Layer Resist (TLR) method that uses an intermediate layer, such as, e.g., a Spin On Glass (SOG) intermediate layer film, when interposed between two photo-resist films, or a silylation method that selectively implants silicon into upper portions of a photoresist film. All of the above described methods aim principally at decreasing the achievable resolution limit.

Meanwhile, a contact for connecting upper and lower conductive lines to each other can be significantly adversely affected by a design rule, as compared to line and space patterns. In more detail, an increase in the integration degree of a semiconductor device causes a reduction in a size of a contact and an interval between the contact and the neighboring conductive line and consequently, causes an increase in an aspect ratio of the contact, that is, a ratio of a diameter to a depth of the contact. Therefore, a contact forming process is important in forming a highly integrated semiconductor devices. Accordingly, in highly integrated semiconductor devices that have multilayered conductive lines, a contact forming process may require an extremely precise and strict mask alignment, may require entailing a reduction in process margin, or may be difficult in progressing a process without a margin.

In the case where a semiconductor device that is 30 nm thick which has buried gates, to substantially prevent a bridge phenomenon between a previously formed hole type bit line contact and a subsequently formed storage node contact, then the hole type bit line contact should have at least a dimension of less than 30 nm. Although various methods for realizing a hole type bit line contact having a dimension of less than 30 nm, for example, a method of performing a reflow process on a photo-resist pattern, or a method using patterning of a spacer, have been proposed, these conventional methods suffer in that it is difficult to form uniform contacts.

BRIEF SUMMARY OF THE INVENTION

Various embodiments of the present invention are directed to providing a method for forming a semiconductor device that substantially obviates one or more problems due to limitations and disadvantages of the related art. According to the related art in which a reduction in a critical dimension of a highly integrated semiconductor device makes it difficult to realize a bit line contact smaller than a bit line, there occurs short circuiting between a previously formed bit line contact and a subsequently formed storage node contact.

In accordance with an aspect of the present invention, a method for forming a semiconductor device includes forming a line type conductive layer on a semiconductor substrate including a buried gate, to expose an upper part of the buried gate, etching the line type conductive layer, to expose at least a region between one side of an active area defined in the semiconductor substrate and an opposite side of the neighboring active area, both the active areas being arranged next to each other in a major axis direction of the buried gate, burying a first insulating film in the etched line type conductive layer, and forming a bit line passing through the center of the active area in a direction perpendicular to the major axis direction of the buried gate. As a result, instead of defining a bit line contact by patterning a contact hole and burying the contact hole, according to the present invention, after a line type conductive layer is formed, a bit line contact is formed during patterning of a bit line, enabling easy formation of a bit line contact having a fine critical dimension.

After formation of the bit line, the semiconductor device forming method may further include forming an interlayer insulating film over the entire bit line, and forming a storage node contact hole by etching the interlayer insulating film to expose the active areas provided at opposite sides of the bit line.

After formation of the storage node contact hole, the semiconductor device forming method may further include forming a conductive material over the entire surface of the semiconductor substrate including the storage node contact hole, and performing a planarization etching process on the conductive material to expose the interlayer insulating film.

The formation of the line type conductive layer may include forming a line type second insulating film on the semiconductor substrate including the buried gate, to cover the upper part of the buried gate, forming the conductive layer over the entire surface of the semiconductor substrate including the line type second insulating film, and performing a planarization etching process on the conductive layer, to expose the line type second insulating film.

The etching of the line type conductive layer may include forming a photo-resist pattern to expose one side partial region of the active area and an opposite side partial region of the neighboring active area of the semiconductor substrate in the major axis direction of the buried gate as well as the region between one side of the active area and the opposite side of the neighboring active area, and etching the line type conductive layer using the photo-resist pattern as an etching mask. Here, since one side partial region and the opposite side partial region of the neighboring active areas include regions where storage node contacts will be formed in a following process, the above described photo-resist pattern serves to substantially prevent connection between the previously described bit line contact layer and the subsequently formed storage node contacts.

The formation of the bit line may include forming a bit line electrode, a nitride film, and a hard mask layer over the semiconductor substrate including the etched line type conductive layer and the first insulating film, and etching the hard mask layer, the nitride film, the bit line electrode, and the conductive layer, to expose the semiconductor substrate.

After the formation of the bit line, the semiconductor device forming method may further include forming a bit line spacer at a sidewall of the bit line.

The etching of the hard mask layer, the nitride film, the bit line electrode, and the conductive layer to expose the semiconductor substrate may be performed based on a difference in etching selectivity with the first insulating film. This substantially prevents the first insulating film from being etched during the formation of the bit line. As a result, it is possible to substantially prevent oxidation of the buried gate while allowing only the conductive layer to be etched, resulting in easy formation of the storage node contact hole in a following process.

The etching of the hard mask layer, the nitride film, the bit line electrode, and the conductive layer to expose the semiconductor substrate may be performed using HBr or $O_2$ gas.

DESCRIPTION OF EMBODIMENTS

Reference will now be made in detail to the embodiments of the present invention, examples of which are illustrated in the accompanying drawings. Wherever possible, the same reference numbers will be used throughout the drawings to refer to the same or like parts. It is also understood herein that the drawings are not necessarily to scale and in some instances proportions may have been exaggerated in order to more clearly depict certain features of the invention.

FIGS. 1A to 1F are views illustrating a method for forming a semiconductor device according to the present invention, (i) of FIGS. 1A to 1F being plan views, (ii) of FIGS. 1A to 1F being sectional views taken along the line A-A', and (iii) of FIGS. 1A to 1F being sectional views taken along the line B-B'.

Figure 1A:
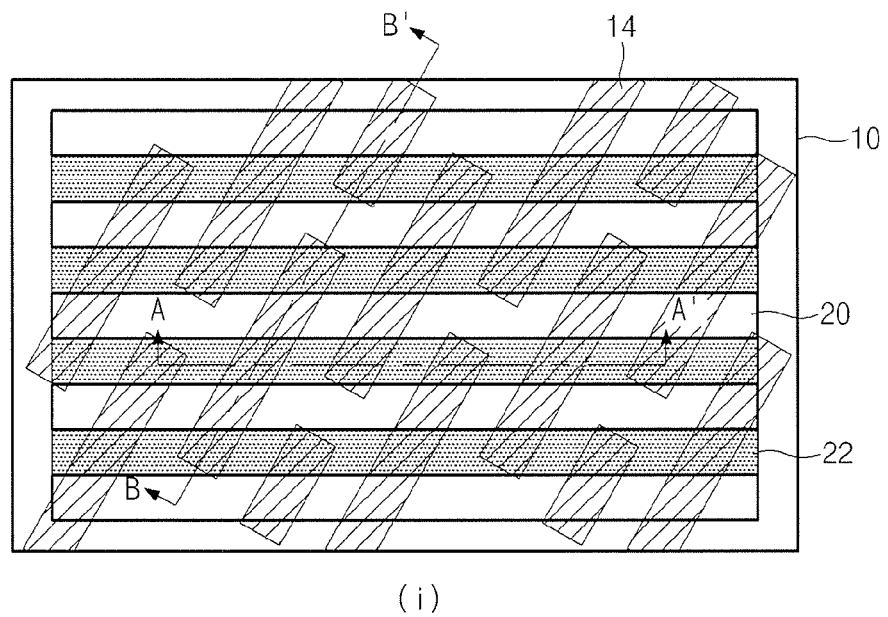
FIGS. 1A to 1F are views illustrating a method for forming a semiconductor device according to the present invention, (i) of FIGS. 1A to 1F being plan views, (ii) of FIGS. 1A to 1F being sectional views taken along the line A-A', and (iii) of FIGS. 1A to 1F being sectional views taken along the line B-B'.
Figure 1A:
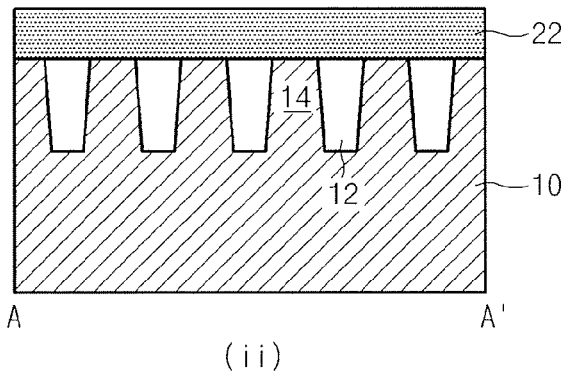
Figure 1A:
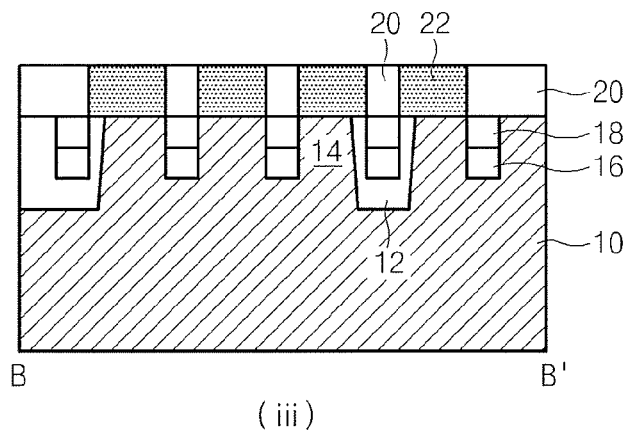

As shown in FIG. 1A, a semiconductor substrate 10 includes active areas 14 defined by a device isolation layer 12, and buried gates formed in the active areas 14. Here, the buried gates are preferably formed in a following process. First, trenches (not shown) for formation of buried gates are formed in the semiconductor substrate 10 and in turn, an oxide film (not shown) is formed on a surface of each of the trenches (not shown). Thereafter, a gate electrode 16 is deposited so as to be buried in a lower part of the trench (not shown). Subsequently, a capping nitride film 18 is formed over the gate electrode 16, so as to be buried in a remaining upper part of the trench (not shown).

Next, an insulating film is formed over the entire surface of the semiconductor substrate 10 including the buried gates. Here, the insulating film is preferably made of an oxide film. Then, after a photo-resist pattern (not shown) is formed on the insulating film that covers the capping nitride film 18 of each of the buried gates, a insulating pattern 20 is formed by etching the insulating film using the photo-resist pattern (not shown) as an etching mask. Here, a part of the semiconductor substrate 10 and the device isolation layer 12 is exposed by the photo-resist pattern (not shown). The insulating pattern 20 is formed line type.

Next, after a conductive material (not show) for formation of bit line contacts is formed over the entire surface of the semiconductor substrate 10, the conductive material (not shown) for formation of bit line contacts is subjected to a planarization etching process to expose the insulating pattern 20, whereby contact lines 22 are formed. According to the related art in which contacts are defined by patterning an insulating film to have holes and by burying the holes of the insulating film, it is difficult to etch the insulating film having the narrow critical dimension holes. Consequently, it is extremely difficult if not impossible to define bit line contacts. However, the contact lines 22 according to the present invention, which are formed via line patterning rather being formed via hole patterning, can basically solve the above described problem of the related art.

Figure 1B:
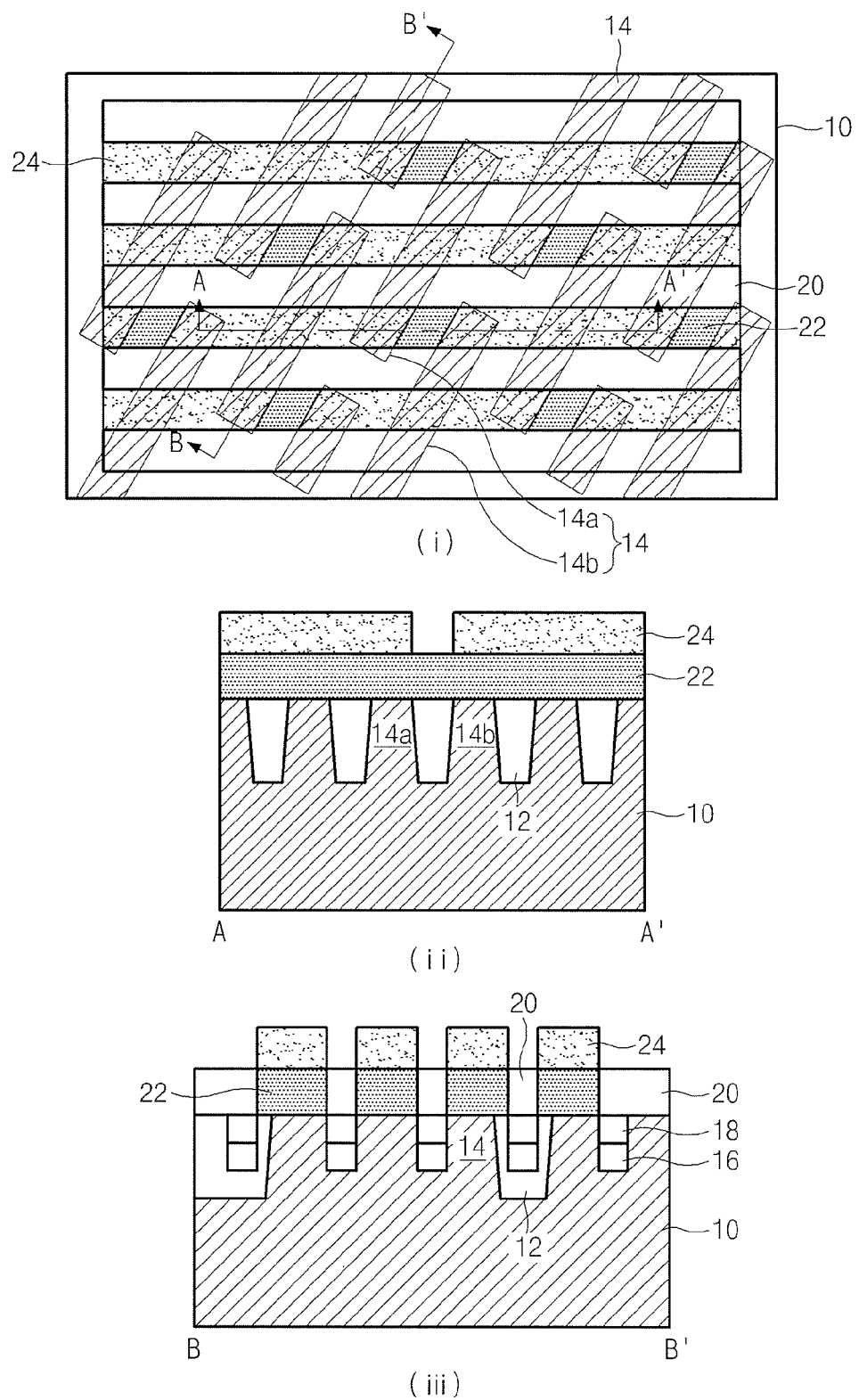
Figure 1C:
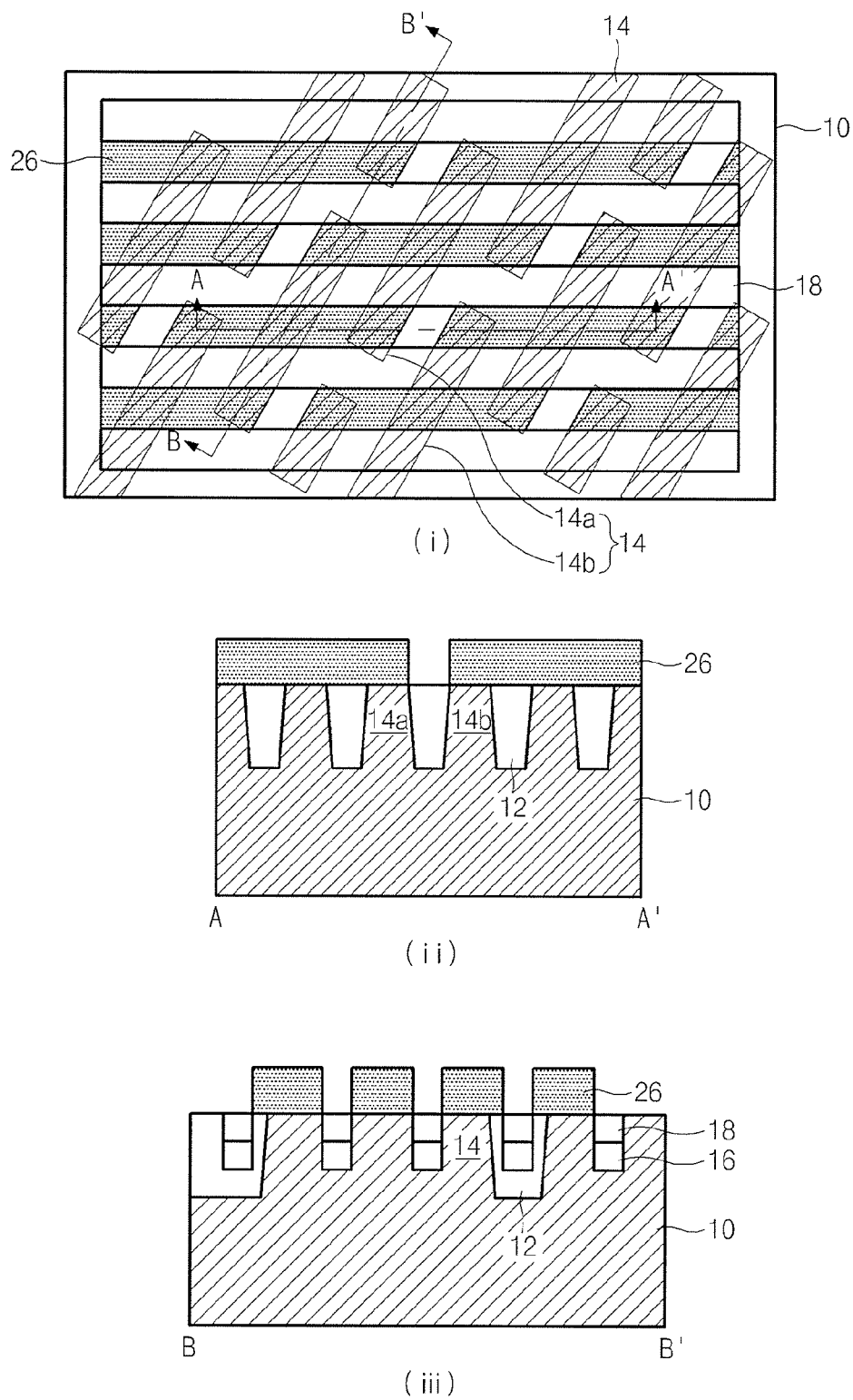

As shown in FIGS. 1B and 1C, a photo-resist pattern 24 is formed over the entire surface of the semiconductor substrate 10 including over the insulating pattern 20 and over the contact lines 22. The photo-resist pattern 24 is used to expose at least a region between one side of a first active area 14a and an opposite side of a second active area 14b neighboring the first active area 14a assuming that both the first active area 14a and the second active area 14b are arranged next to each other along a major axis direction as defined by the buried gate (FIG. 1B). In more detail, the photo-resist pattern 24 is preferably formed to expose one side partial region of the first active area 14a and an opposite side partial region of the second active area 14b neighboring the first active area 14a along the major axis direction of the buried gate as well as the region between one side of the first active area 14a and the opposite side of the second active area 14b neighboring the first active area 14a. Here, one side partial region and the opposite side partial region of the neighboring active areas 14 include regions where storage node contacts will be formed in a subsequent following process. Next, the insulating pattern 20 and the contact lines 22 are etched using the photo-resist pattern 24 as an etching mask to form a contact pattern 26 (FIG. 1C). During this etching process, a partial region of the contact line 22, located below the region between one side of the first active area 14a and the opposite side of the second active area 14b neighboring the first active area 14a along the major axis direction of the buried gate, is then removed to expose the semiconductor substrate 10. This has the effect of substantially preventing the storage node contacts from being connected to each other via the contact line 22. The storage node contacts will be formed in a subsequent process at one side of the first active area 14a and the opposite side of the second active area 14b neighboring the first active area 14a along the major axis direction of the buried gate.

Figure 1D:
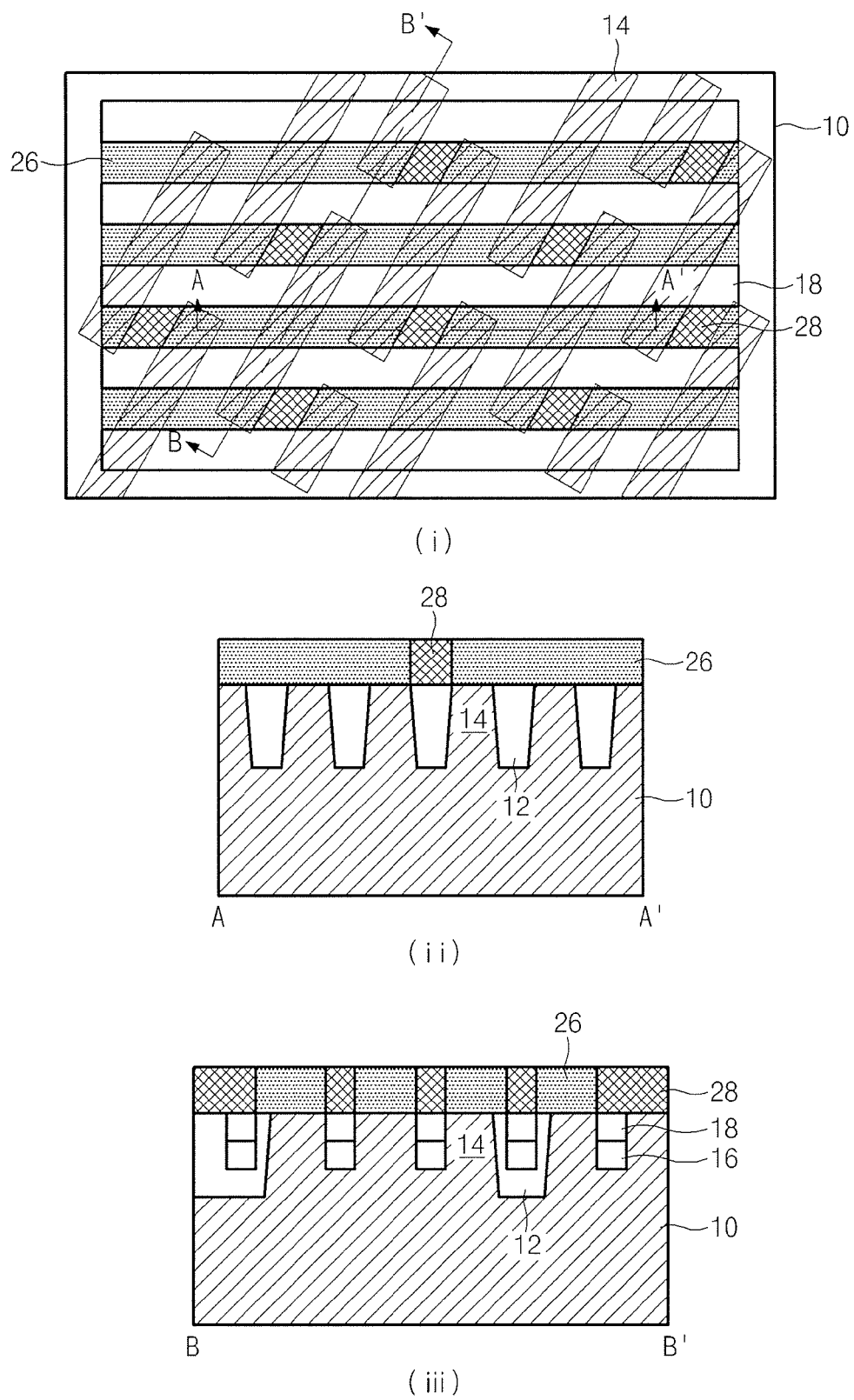

As shown in FIG. 1D, after an insulating film is deposited over the entire surface including the contact pattern 26, a insulating pattern 28 is formed by performing a planarization etching process on the insulating film which exposes the contact pattern 26. As a result, the insulating pattern 28 is preferably buried in spaces of the contact pattern 26.

Figure 1E:
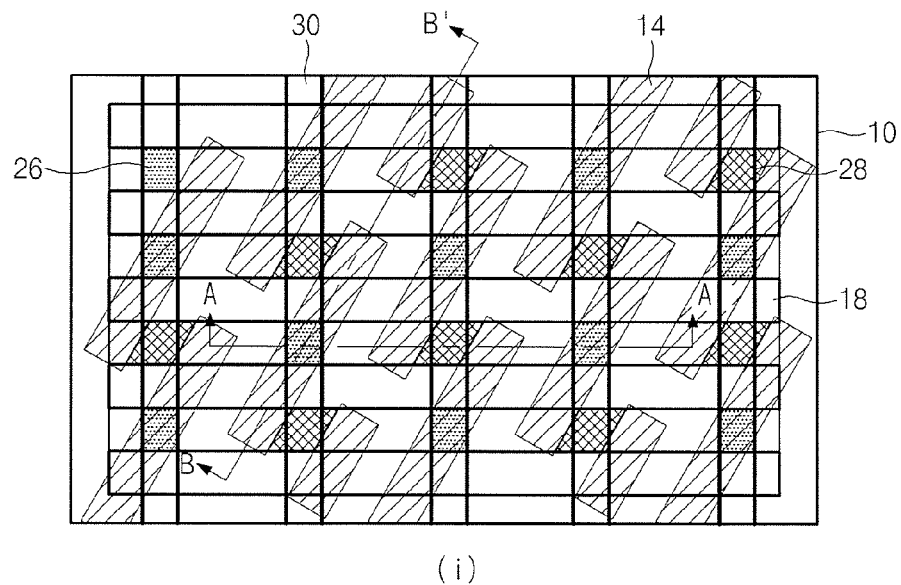
Figure 1E:
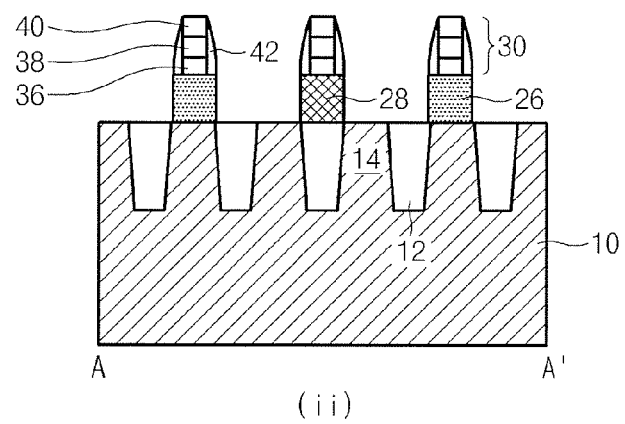
Figure 1E:
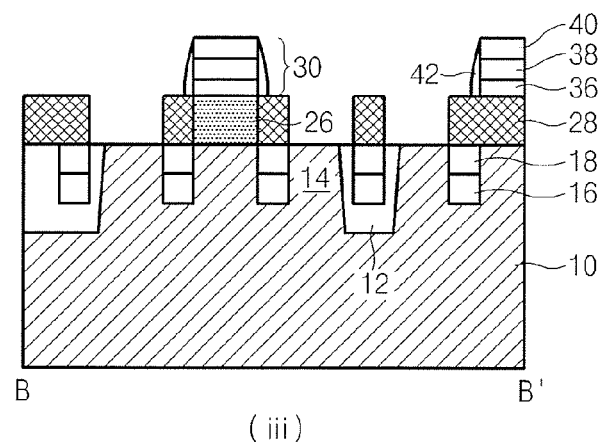

As shown in FIG. 1E, after bit line electrodes 36, a nitride film 38, and a hard mask layer 40 are formed on the entire surface of the semiconductor substrate 10, the hard mask layer 40, the nitride film 38, the bit line electrodes 36, and the contact pattern 26 are then etched using a photo-resist pattern (not shown) to define the bit lines 30. In this case, bit line spacers 42 are preferably formed on sidewalls of the bit lines 30. Here, the bit lines 30 are preferably formed by using an HBr or $O_2$ gas etching process. The above described etching process is accomplished based on a difference in etching selectivity with the insulating film 28 remaining on the semiconductor substrate 10. Therefore, the insulating film 28 that remains on the semiconductor substrate 10 is not etched by the above described etching process and therefore substantially prevents oxidation of the buried gate. In addition, during the patterning of the bit lines 30, a partial region of the contact pattern 26 under the bit lines 30 remains, but the remaining region of the contact pattern 26 is removed to expose the semiconductor substrate 10. As a result, bit line contacts can be formed during the patterning of the bit lines 30 without requiring an additional process for formation of the bit line contacts. In addition, regions where the storage node contacts will be formed in a following process are defined simultaneously with the patterning of the bit lines 30. Accordingly, it is possible to precisely expose predetermined locations of the semiconductor substrate 10 to which the storage node contacts are connected, prior to performing a process for defining storage node contact holes.

Figure 1F:
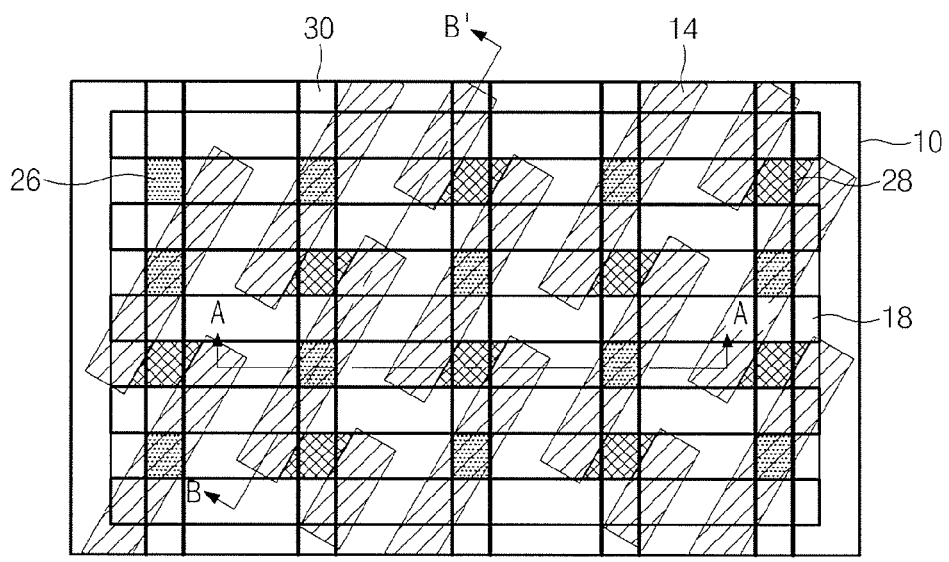
Figure 1F:
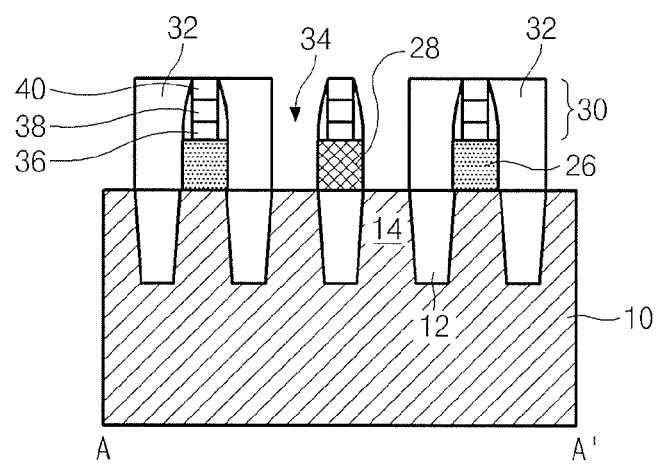
Figure 1F:
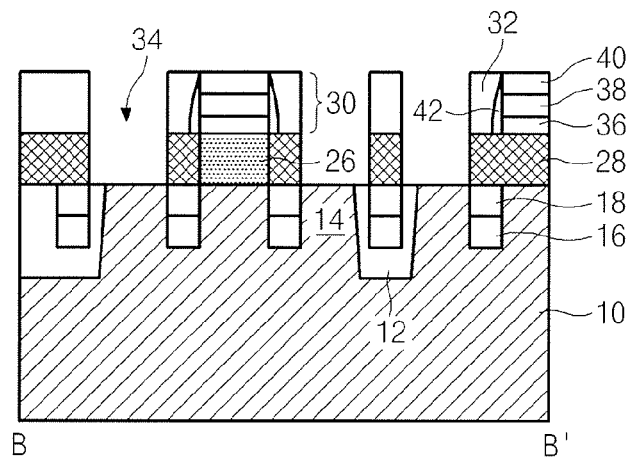

As shown in FIG. 1F, after an interlayer insulating film 32 is formed over the entire surface of the semiconductor substrate 10 including the bit lines 30, the interlayer insulating film 32 is subjected to a planarization etching process that exposes a hard mask layer 40 as an uppermost layer of the bit lines 30. Here, the interlayer insulating film 32 preferably includes Boron Phosphorus Silicate Glass (BPSG). After a photo-resist pattern (not shown), used to define storage node contact holes, is formed on the interlayer insulating film 32, the interlayer insulating film 32 is etched using the photo-resist pattern as an etching mask to form the storage node contact holes 34. In this case, since a lower part of the storage node contact hole 34 has been previously defined to expose the semiconductor substrate 10 in the previous process for the patterning of the bit lines 30, then forming the storage node contact holes 34 that expose the semiconductor substrate 10 can be easily achieved. When the storage node contact holes 34 are formed by the above described etching process, there occurs a slight loss of only the exposed bit line spacers 42, but the hard mask layer 40 as the uppermost layer of the bit lines 30 has substantially no loss. Therefore, no problem occurs even if the hard mask layer 40 has a small thickness. This may reduce an aspect ratio of the bit lines 30 and consequently, may increase a patterning margin of the bit lines 30.

Subsequently, although not shown, after a conductive material for formation of storage node contacts is formed over the entire surface of the semiconductor substrate 10, preferably, the conductive material for formation of storage node contacts is subjected to a planarization etching process that exposes the interlayer insulating film 32 to form storage node contacts.

In the above described method for forming the bit line contacts according to the embodiment of the present invention is presented. Instead of forming the bit line contacts by patterning contact holes and burying the contact holes, a bit line contact layer is formed so that the bit line contacts can be formed during patterning of the bit lines which realizes an easy formation of the bit line contacts that have fine critical dimension, i.e., highly resolved structures.

As is apparent from the above description, the method for forming a semiconductor device according to the embodiment of the present invention can basically solve a short circuiting problem between a bit line contact and a storage node contact caused by a difficulty in forming the bit line contact having a critical dimension smaller than a bit line with relation to patterning of a bit line contact.

The above embodiments of the present invention are illustrative and not limitative. Various alternatives and equivalents are possible. The invention is not limited by the type of deposition, etching polishing, and patterning steps described herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A method for forming a semiconductor device comprising:
    forming a buried gate in a semiconductor substrate;
    forming a line type conductive layer over a semiconductor substrate to electrically couple to the buried gate;
    forming contact patterns by etching the line type conductive layer to expose at least a region between one side of a first active area defined in the semiconductor substrate and an adjacent opposing side of a second active area defined in the semiconductor substrate, wherein both the first active area and the second active area are arranged next to each other along a major axis direction as defined by the buried gate;
    forming a first insulating film between the contact patterns;
    forming a bit line passing through the center of the active area in a direction substantially perpendicular to the major axis direction of the buried gate.

2. The method according to claim 1, further comprising: after formation of the bit line,
    forming an interlayer insulating film over the entire bit line; and
    forming a storage node contact hole by etching the interlayer insulating film to expose the active areas at opposing sides of the bit line.

3. The method according to claim 1, wherein the formation of the line type conductive layer includes:
    forming a line type second insulating film on the semiconductor substrate including the buried gate, to cover an upper part of the buried gate;
    forming the conductive layer over the entire surface of the semiconductor substrate including the line type second insulating film; and
    performing a planarization etching process on the conductive layer, to expose the line type second insulating film.

4. The method according to claim 1, wherein the etching of the line type conductive layer includes:
    forming a photo-resist pattern to expose one side partial region of the first active area and to expose an opposing side partial region of the second active area of the semiconductor substrate along the major axis direction of the buried gate and along a region between one side of the first active area and the opposing side of the second active area; and etching the line type conductive layer using the photoresist pattern as an etching mask.

5. The method according to claim 1, wherein the formation of the bit line includes:
   forming a bit line electrode, a nitride film, and a hard mask layer over the semiconductor substrate including the etched line type conductive layer and the first insulating film; and
   etching the hard mask layer, the nitride film, the bit line electrode, and the contact patterns, to expose the semiconductor substrate.

6. The method according to claim 2, further comprising:
after formation of the storage node contact hole,
   forming a conductive material over the entire surface of the semiconductor substrate including the storage node contact hole; and
   performing a planarization etching process on the conductive material to expose the interlayer insulating film.

7. The method according to claim 5, further comprising forming a bit line spacer at a sidewall of the bit line after forming the bit line.

8. The method according to claim 5, wherein the etching of the hard mask layer, the nitride film, the bit line electrode, and the contact patterns to expose the semiconductor substrate is performed based on a difference in etching selectivity as opposed to the first insulating film.

9. The method according to claim 5, wherein the etching of the hard mask layer, the nitride film, the bit line electrode, and the contact patterns to expose the semiconductor substrate is performed using HBr or $O_2$ gas.

* * * * *